March 21, 1967 J. RUPPRECHT 3,310,493
HALOGEN DOPED $Bi_2Te_3$-$Bi_2Se_3$-$As_2Se_3$ THERMO-ELECTRIC COMPOSITION
Filed May 2, 1963
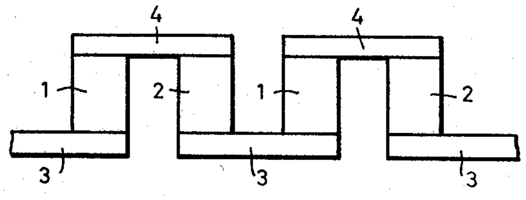

United States Patent Office 3,310,493

Patented Mar. 21, 1967

3,310,493

HALOGEN DOPED $Bi_2Te_3$-$Bi_2Se_3$-$As_2Se_3$ THERMOELECTRIC COMPOSITION

Joachim Rupprecht, Nurnberg, Germany, assignor to Siemens-Schuckertwerke Aktiengesellschaft, Berlin-Siemensstadt, Germany, a corporation of Germany Filed May 2, 1963, Ser. No. 277,616

Claims priority, application Germany, June 29, 1962, S 80,142

4 Claims. (Cl. 252—62.3)

My invention relates to thermoelectric semiconductor devices and in a particular aspect to semiconductors for use as thermocouple legs in Peltier piles or batteries.

The thermocouples employed for electric cooling on the Peltier principle are composed of semiconductor components or legs which in each pair have n-type and p-type conductance respectively. The suitability of the semiconductor for such purposes is predicated upon exhibiting a high value of thermoelectric effectivity ($z$) defined by:

$$z=\frac{\alpha^2\sigma}{k}$$

wherein $\alpha$ denotes the thermoforce, $\sigma$ the electric conductance, and $k$ the thermal conductance.

Also of importance for use of a semiconductor material as a Peltier couple leg is the temperature dependence of the effectivity $z$ in the rated range of operating temperatures which generally extends from +40° C. to lowest feasible temperatures. The quality of a Peltier couple can be expressed by the maximal temperature difference $\Delta T_{max}$ attained by a couple of a p-type leg and an n-type leg in a cooling test from about +40° C. downward. This quality value is defined as $$\Delta T_{max}=\frac{z\cdot T_k^2}{2}$$

in which $T_k$ denotes the temperature of the cold junction. A good Peltier semiconductor, therefore, is not only supposed to have high effectivity at room temperature, but the effectivity must also be as high as possible within the entire range of operating temperatures.

It is known to use for the n-type leg of Peltier couples an alloy constituted by a mix-crystal of the system $Bi_2Te_3$-$Bi_2Se_3$. The alloy of 80 mole percent $Bi_2Te_3$ and 20 mole percent $Bi_2Se_3$ with a suitable doping substance has been considered particularly well suitable because of its minimal lattice thermal conductance. The effectivity of this allow at room temperature (20° C.) is $$z=2.6\cdot 10^{-3}/°\ C.$$

It is an object of my invention to further improve n-type semiconductors, particularly those for Peltier couples, with respect to their thermoelectric properties.

According to my invention, a thermoelectric semiconductor member of n-type conductance is formed of an alloy of the system $Bi_2Te_3$-$Bi_2Se_3$-$As_2Se_3$ having a percentile molecular composition of the components within the range from 2.0 mole percent $Bi_2Se_3$, 2.0 mole percent $As_2Se_3$ and 96 mole percent $Bi_2Te_3$ to 15.0 mole percent $Bi_2Se_3$, 5.0 mole percent $As_2Se_3$ and 80 mole percent $Bi_2Te_3$, the semiconductor member being doped for thermoelectric effectivity with halogen or metal halogenide.

Preferably employed as halogen dopant is chlorine, although I and Br are likewise well suitable. Preferably used as a metal halogenide is copper bromide (CuBr).

I have discovered that within the above-stated range of composition the halogen doping not only secures high effectivity at room temperature (20° C.), but also higher maximal temperature differences in the working temperature range from +40° C. downward than obtained with the alloy of 80 mole percent $Bi_2Te_3$-20 mole percent $Bi_2Se_3$, heretofore considered to afford optimal thermoelectric properties.

Relative to $Bi_2Te_3$ alloys that contain $As_2Se_3$ exclusively, the doped ternary alloy according to the invention has the further advantage of readily lending itself to the production of homogeneous material and avoidance of irregularly crystallized regions by application of the "normal freezing" method.

Semiconductor members of n-type conductance according to the invention are applicable, together with suitable p-type members, in couples for cooling purposes. The data for the maximal attainable temperature reduction $\Delta T_{max}$ stated in the following Table 1, were measured with three different semiconductor members according to the invention in combination with mix-crystal p-type leg composed of 20 mole percent $Sb_2Te_3$ and 30 mole percent $Bi_2Te_3$ having an effectivity of $z=2.0\times 10^{-3}/°$ C. at 25° C.

TABLE 1

| Semiconductor: | $\Delta T_{max}$[° C.] |
|---|---|
| I | 65 |
| II | 76 |
| III | 70 |

The temperature of the hot junctions in all cases was +40° C.

The semiconductor members I, II and III were composed as follows:

*Semiconductor I:*
- 96 mole percent $Bi_2Te_3$
- 2 mole percent $Bi_2Se_3$
- 2 mole percent $As_2Se_3$
- +0.05 weight-percent CuBr

*Semiconductor II:*
- 88 mole percent $Bi_2Te_3$
- 10 mole percent $Bi_2Se_3$
- 2 mole percent $As_2Se_3$
- +0.04 weight-percent Cl

*Semiconductor III:*
- 85 mole percent $Bi_2Te_3$
- 10 mole percent $Bi_2Se_3$
- 5 mole percent $As_2Se_3$
- +0.05 weight-percent CuBr The following Table 2 indicates the thermoelectric properties of the semiconductor member II:

TABLE 2

| | |
|---|---|
| Thermoforce, $\alpha[\mu V/degree]$ | —185 |
| Electric conductance, $\sigma[\Omega^{-1}\ cm.^{-1}]$ | 1282 |
| Thermal conductance, $k\cdot 10^{+2}$[W/cm.·degree] | 1.4 |
| Thermoelectric effectivity, $z\cdot 10^3$[degree$^{-1}$] | 3.1 |

When using copper bromide as doping substance, the most favorable doping range has been found to be from 0.03% to 0.06% copper bromide by weight of the total composition. The most favorable range for chlorine as doping substance is between 0.01 and 0.06% by weight. Generally, any other halogen is also suitable as a dopant within a range of 0.01 to 0.1% by weight.

The weighed quantities for the above-mentioned semiconductor bodies are listed in Table 3.

TABLE 3

| Semiconductor | Te [g] | Bi [g] | Sb [g] | Se [g] |
|---|---|---|---|---|
| I | 28.7050 | 8.1747 | 12.8763 | 0.2439 |
| II | 29.1149 | 7.4274 | 12.9813 | 0.4762 |
| III | 29.5811 | 5.8531 | 13.6398 | 0.9259 |

The mix-crystal semiconductors according to the invention were produced by the preferred method described presently. The above-described quantities of the constituents for each semiconductor were first melted together in an evacuated quartz tube at 800° C., thus producing a prealloy. Thereafter the prealloy was subjected to cooling and solidification by the "normal freezing method." That is, the melt, contained in an elongated crucible or boat, was caused to gradually freeze from one end to the other. The normal freezing was performed at a temperature of about 800° C. at a rate of about 0.6 cm./h. The normal freezing step can also be performed by the known zone melting method. In this manner, excellent products, exhibiting the above-described qualities are obtained.

The accompanying drawing shows by way of example a Peltier pile containing semiconductor legs according to the invention. The pile is composed of p-type legs 1 of prismatic shape consisting of a mix-crystal with tellurium n-type legs 2 of prismatic shape. The n-type legs 2 consist of a ternary mix-crystal of $Bi_2Te_3$-$Bi_2Se_3$-$As_2Se_3$ doped with halogen according to the invention as described above. The alternately p-type and n-type legs are spaced from each other, and each two adjacent ones are electrically interconnected by bridge pieces 3 or 4 of copper. The pile may comprise more pairs of legs than illustrated, and several rows of legs may be composed to form a battery or block. All legs of the pile are electrically connected in series. When current passes through the pile, all hot junctions are located on one and the same side, for example the side of bridge pieces 4 and all cold junctions on the side of the other bridge pieces. The bridge pieces may be joined with heat-exchanging or heat-dissipating fins or other devices for transmitting or supplying heat, depending upon the particular use to be made of the device.

The p-type legs 1 of Peltier couples according to the invention may consist of the above-mentioned $Sb_2Te_3$-$Bi_2Te_3$ mixed crystals composed of 70 mole percent $Sb_2Te_3$ and 30 mole percent $Bi_2Te_3$. However, any other suitable p-type thermoelectric materials may be used. Particularly favorable results are obtained when using p-type legs according to my copending application Ser. No. 277,617, filed concurrently herewith now abandoned, which consist of a mixed crystal of bismuth telluride and antimony telluride within the range of 73 to 80 mole percent $Sb_2Te_3$ and 20 to 27 mole percent $Bi_2Te_3$ and which contain an excess of tellurium above stoichiometry in an amount of 2 to 8% relative to the weight of the total composition and also a selenium addition of 0.5 to 5%, preferably not more than 3%, by weight of the total composition. This p-type thermoelectric semiconductor composition can be produced by the same method as the one described above with reference to the n-type doped ternary composition, namely by melting the above-mentioned components of the p-type material in an evacuated quartz tube at 800° C., and then subjecting the melt to normal freezing from a temperature of about 800° C. at a rate of approximately 0.6 cm. per hour either by cooling the melt progressively from one end of the crucible to the other or by applying the zone-melting method.

I claim:

1. A thermoelectric semiconductor member of n-type conductance consisting of an alloy of the system $Bi_2Te_3$-$Bi_2Se_3$-$As_2Se_3$ in a percentile molecular composition within the range from 2.0 mole percent $Bi_2Se_3$, 2.0 mole percent $As_2Se_3$ and 96 mole percent $Bi_2Te_3$ to 15.0 mole percent $Bi_2Se_3$, 5.0 mole percent $As_2Se_3$ and 80 mole percent $Bi_2Te_3$, said member being doped for thermoelectric effectivity with 0.01 to 0.1% by weight of substance from the group consisting of halogens and copper bromide.

2. A thermoelectric semiconductor member of n-type conductance consisting of a $Bi_2Te_3$-$Bi_2Se_3$-$As_2Se_3$ alloy in the range from 2.0 mole percent $Bi_2Se_3$, 2.0 mole percent $As_2Se_3$ and 96 mole percent $Bi_2Te_3$ to 15.0 mole percent $Bi_2Se_3$, 5.0 mole percent $As_2Se_3$ and 80 mole percent $Bi_2Te_3$, said member being doped with 0.01 to 0.1 weight-percent of halogen.

3. A thermoelectric semiconductor member of n-type conductance consisting of a $Bi_2Te_3$-$Bi_2Se_3$-$As_2Se_3$ alloy in the range from 2.0 mole percent $Bi_2Se_3$, 2.0 mole percent $As_2Se_3$ and 96 mole percent $Bi_2Te_3$ to 15.0 mole percent $Bi_2Se_3$, 5.0 mole percent $As_2Se_3$ and 80 mole percent $Bi_2Te_3$, said member being doped with copper bromide (CuBr) in an amount of 0.03 to 0.06% by weight.

4. The method of producing a thermoelectric semiconductor member of n-type conductance, which comprises preparing in vacuum at about 800° C. a molten pre-alloy of $Bi_2Te_3$-$Bi_2Se_3$-$As_2Se_3$ in the range from 2.0 mole percent $Bi_2Se_3$, 2.0 mole percent $As_2Se_3$ and 96 mole percent $Bi_2Te_3$ to 15.0 percent $Bi_2Se_3$, 5.0 mole percent $As_2Se_3$ and 80 mole percent $Bi_2Te_3$, with an addition of 0.01 to 0.1% by weight of substance from the group consisting of halogens and copper bromide, and subjecting the melt to normal freezing from a temperature of about 750° C. at a rate of about 0.6 cm. per hour.

References Cited by the Examiner

Egli: Thermoelectricity, John Wiley and Sons, 1960, pages 136–145.

Gordiakova et al.: Investigation of Thermoelectric Properties of Solid Solutions $Bi_2Te_3$-$Bi_2Se_3$, Soviet Physics, volume 3, No. 1, January 1958, pages 1–14.

Sinani et al., Solid Solutions of $Bi_2Te_3$-$Bi_2Se_3$ as Materials for Thermoelements-Zhurnal Tekhnicheskoy Fiziki, volume XXVI, No. 10, pages 2398–2399 (1956).

Selenium and Tellurium Abstracts—volume 3, No. 5, May 1962, Battelle Memorial Institute, page 635, Abstract No. 1109.

TOBIAS E. LEVOW, *Primary Examiner.*

MAURICE A. BRINDISI, *Examiner.*

R. D. EDMONDS, *Assistant Examiner.*